United States Patent
Fukusumi et al.

(10) Patent No.: US 6,831,477 B2
(45) Date of Patent: Dec. 14, 2004

(54) MOTOR ABNORMALITY DETECTING APPARATUS

(75) Inventors: Kouji Fukusumi, Tokyo (JP); Masahiko Kurishige, Tokyo (JP); Noriyuki Inoue, Tokyo (JP); Seiji Sakanishi, Tokyo (JP); Kenichi Kawakami, Tokyo (JP); Takayuki Kifuku, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 62 days.

(21) Appl. No.: 10/378,659

(22) Filed: Mar. 5, 2003

(65) Prior Publication Data

US 2003/0179004 A1 Sep. 25, 2003

(30) Foreign Application Priority Data

Mar. 8, 2002 (JP) ...................................... 2002-063405
Jan. 9, 2003 (JP) ...................................... 2002-003405

(51) Int. Cl.[7] ............................................. G01R 31/34
(52) U.S. Cl. ..................................................... 324/772
(58) Field of Search ................................. 324/772, 500, 324/545, 72.5; 73/116; 702/32–34, 54, 56; 318/245, 280, 432, 434, 461, 490

(56) References Cited

U.S. PATENT DOCUMENTS 5,032,995 A  *  7/1991 Matsuda et al. .............. 701/34
5,912,539 A  *  6/1999 Sugitani et al. ............. 318/434
6,577,137 B1 *  6/2003 Fisher ......................... 324/772
6,727,725 B2 *  4/2004 Devaney et al. ............ 324/772

FOREIGN PATENT DOCUMENTS

| JP | 11-55992 | 2/1999 |
|---|---|---|
| JP | 2001-310750 | 11/2001 |
| JP | 2001-315657 | 11/2001 |

* cited by examiner

*Primary Examiner*—David A. Zarneke
*Assistant Examiner*—Jermele Hollington
(74) *Attorney, Agent, or Firm*—Leydig, Voit & Mayer, Ltd.

(57) ABSTRACT

An identification is made of an abnormal condition in a motor due to an influence of a disturbance voltage, without addition of hardware, by estimating the disturbance voltage based on a target voltage and actual current flowing in the motor. An apparatus for detecting the abnormal condition of a motor in an electric power steering apparatus includes a motor current detecting unit for detecting an actual current flowing through the motor; a feedback controlling unit for feedback-controlling a target voltage value that gives the motor a driving command in accordance with the deviation of the actual current from an input target current; an abnormal voltage estimating unit for, based on the target voltage and the actual current, estimating an abnormal voltage estimation value corresponding to a voltage indicating an abnormal condition of the motor; and a motor abnormality judging unit for judging abnormality of the motor based on a comparison of the abnormal voltage estimation value with an abnormal voltage value previously stored.

8 Claims, 13 Drawing Sheets

MOTOR ABNORMALITY DETECTING APPARATUS

BACKGROUND OF THE INVENTION

1. Field of the Invention

The present invention relates in general to an apparatus for detecting an abnormal condition of a motor. In particular, the invention relates to an apparatus for detecting an abnormal condition of a motor in an electric power steering apparatus in which steering torque generated in a shaft due to the operation by a driver is assisted with a motor.

2. Description of the Related Art

FIG. 16 is a block diagram showing a configuration of a conventional apparatus for detecting an abnormal condition of a motor for use in an electric power steering apparatus. The configuration of the conventional apparatus for detecting an abnormal condition of a motor will be described hereinafter with reference to FIG. 16.

In FIG. 16, reference numeral 1 designates a steering torque detector connected to a steering torque sensor mounted to a steering column shaft (not shown), and reference numeral 6 designates a phase compensator for, in response to an output signal from the steering torque detector 1, compensating for its phase.

In addition, reference numeral 13 designates a vehicle speed detector connected to a sensor for detecting the rotation and the like of a vehicle shaft (not shown) to output a vehicle speed signal, and reference numeral 2 designates a steering torque controller for determining a necessary steering torque in response to both an output signal of the phase compensator 6 and an output signal of the vehicle speed detector 13.

Reference numeral 5 designates a motor current determining unit for determining a current value of a motor required to generate the torque value determined by the steering torque controller 2, reference numeral 3 designates a current feedback controller including an adder-subtractor 11, reference numeral 7 designates a motor driver, reference numeral 8 designates a driving motor of the power steering apparatus, and reference numeral 9 designates a motor current detector for detecting a current value of the motor 8 to negatively feedback the detected current value to the adder-subtractor 11.

Next, the description will be given hereinafter with respect to the operation of the conventional apparatus for detecting an abnormal condition of a motor having the above-mentioned configuration for use in the electric power steering apparatus.

First of all, upon detection of the torque of a steering wheel by the steering torque detector 1, the phase compensator 6 compensates for the phase delay of the torque detected by the steering torque detector 1 to input its output signal to the steering torque controller 2. Also, the vehicle speed signal detected by the vehicle speed detector 13 is inputted to the steering torque controller 2. Then, the steering torque controller 2, on the basis of both the input signals, determines a torque value used to assist the steering torque generated by a driver through the operation of a steering wheel.

Then, the steering torque controller 2 inputs the torque value to be assisted to the motor current determining unit 5 to determine a target current. The adder 10, on the basis of the target current, adds an output signal of the current feed forward controller 4 and an output signal of the current feedback controller 3 to each other. Then, a signal which is obtained by integrating an output signal of the adder 10 and a battery voltage in an integrator 12 is inputted to the motor driver 7 to carry out the control so that an output torque of the motor 8 becomes a desired torque.

In addition, the current flowing through a coil of the motor 8 is detected in the form of an actual current value by the motor current detector 9 to be fed back to the feedback controller 3 through the adder-subtractor 11.

With the configuration as described above, for the detection of an abnormal condition of a motor, heretofore, as described in JP 2001-310750 A for example, an abnormal condition is detected on the basis of a difference between a target voltage and an actually measured voltage developed across motor terminals by the motor abnormality detector 15.

In addition, with the technique described in JP 8-310416 A, an abnormal condition of a motor is detected on the basis of a difference between a target current and a detected motor current.

However, there is encountered a problem in that when a disturbance voltage is generated between a target voltage or a voltage developed across motor terminals and a voltage actually applied to a motor coil, this disturbance voltage can not be directly detected.

SUMMARY OF THE INVENTION

In the light of the foregoing, an apparatus for detecting an abnormal condition of a motor according to the present invention has been made in order to solve the above-mentioned problems associated with the prior art, and it is, therefore, an object of the present invention to estimate a disturbance voltage (an abnormal voltage value caused by the influence of a disturbance voltage due to breakage, abrasion and flaws of a commutator and brushes of a motor, or a foreign object got mixed into the inside of a motor, broken pieces of internal components or parts of a motor, or the like for example) from a difference between a target voltage and an actual current of a motor to thereby judge an abnormal state of a motor due to the influence of such a disturbance voltage without adding hardware.

According to the present invention, there is provided an apparatus for detecting an abnormal condition of an electric motor, including:

motor current detecting means for detecting an actual current caused to flow through the motor;

feedback controlling means for feedback-controlling a target voltage value that gives the motor a driving command in accordance with the deviation of the actual current from an inputted target current;

abnormal voltage estimating means for on the basis of the target voltage and the actual current, estimating an abnormal voltage estimation value corresponding to a voltage exhibiting an abnormal condition caused in the motor;

commutation frequency arithmetically operating means for arithmetically operating a commutation frequency on the basis of a rotational speed of the motor, and the number of commutators and the number of brushes of the motor;

a filter device for changing a filter frequency in accordance with the commutation frequency to filter the abnormal voltage estimation value estimated by the abnormal voltage estimating means; and motor abnormality judging means for judging an abnormal condition of the motor on the basis of the comparison of the abnormal voltage estimation value filtered by the filter device with a predetermined abnormal voltage value previously stored.

BRIEF DESCRIPTION OF THE DRAWINGS

The above and other objects as well as advantages of the present invention will become clear by the following description of the preferred embodiments of the present invention with reference to the accompanying drawings, wherein.

DESCRIPTION OF THE PREFERRED EMBODIMENTS

The preferred embodiments of the present invention will hereinafter be described in detail with reference to the accompanying drawings.

First Embodiment

Figure 1:
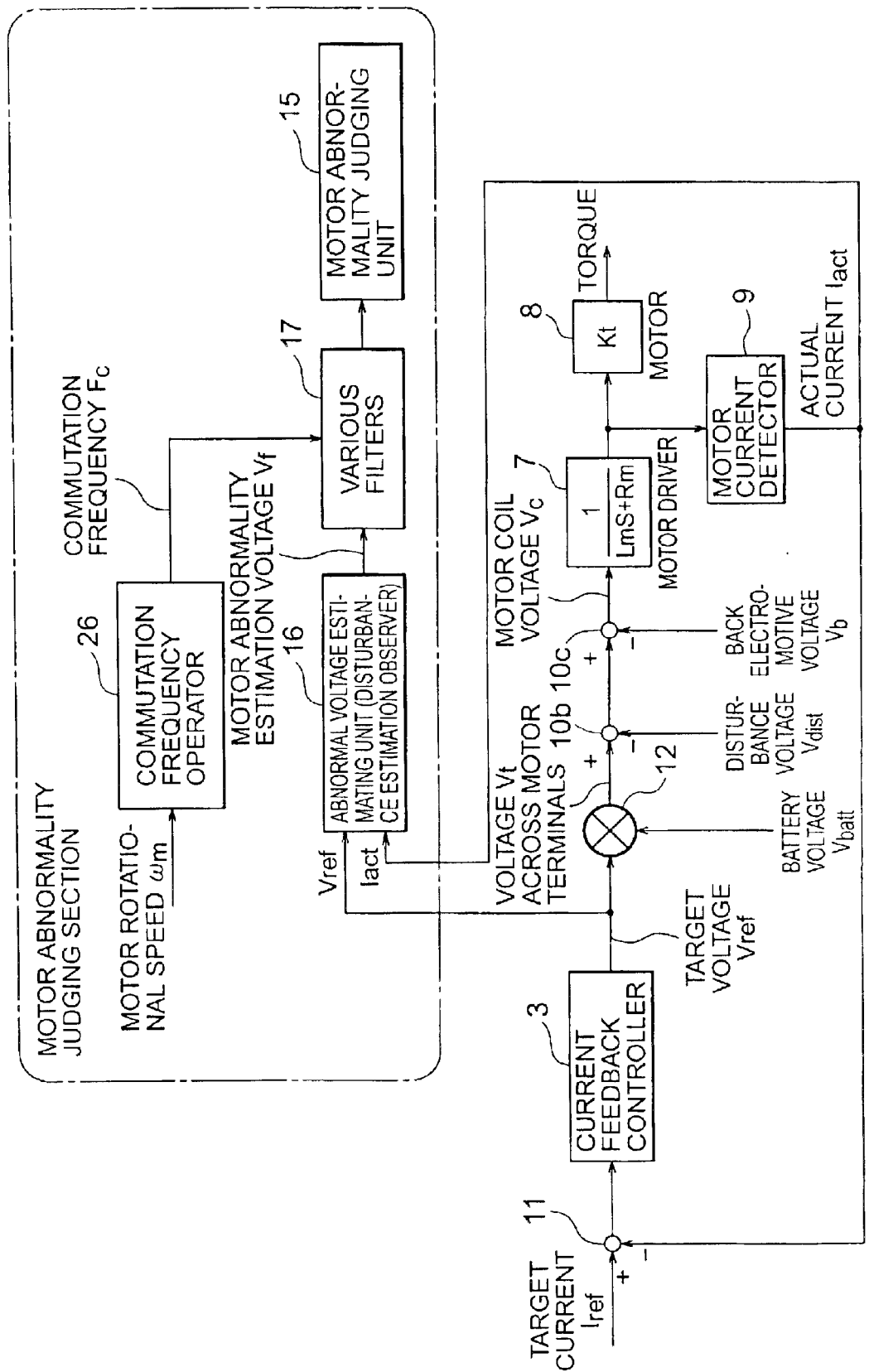
FIG. 1 is a block diagram, partly in circuit diagram, showing a configuration of an apparatus for detecting an abnormal condition of a motor according to a first embodiment of the present invention.
Figure 16:
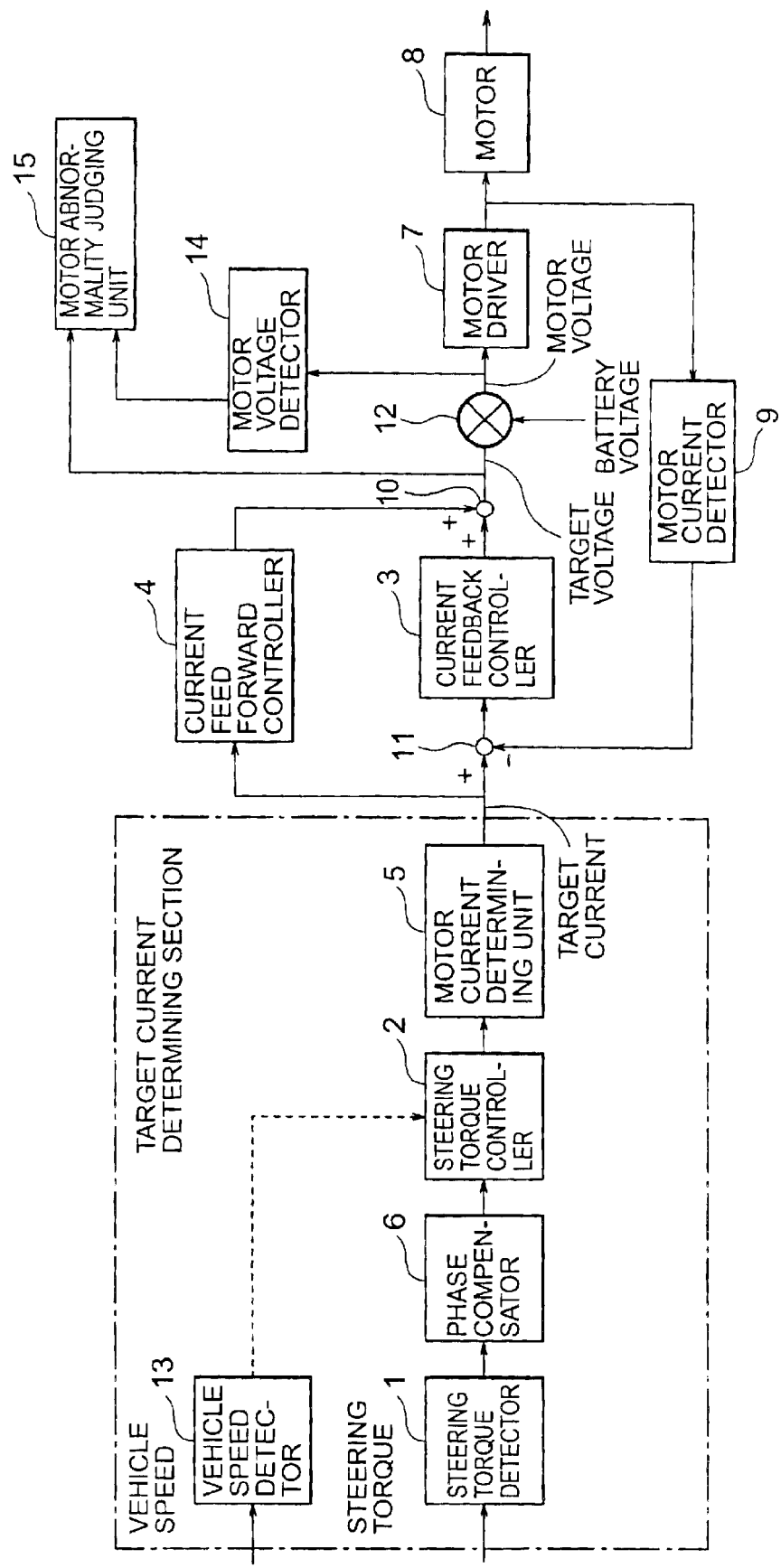
FIG. 16 is a block diagram, partly in circuit diagram, showing a configuration of a conventional apparatus for detecting an abnormal condition of a motor for use in an electric power steering apparatus.

FIG. 1 shows a configuration of an apparatus for detecting an abnormal condition of a motor for use in an electric power steering apparatus, according to a first embodiment of the present invention. Since in the configuration shown in FIG. 1, a partial configuration with respect to up to the determination of a target current on the basis of inputs of a steering torque and a vehicle speed, and a partial configuration with respect to the output of a signal exhibiting a torque based on a difference between the target current and a motor detection current are the same as those of the prior art described with reference to FIG. 16, the description thereof is omitted here for the sake of simplicity.

Now, in FIG. 1, for the current feedback controller 3, for example, there is conceivable the PID control using a proportional gain $K_p$, an integrating gain $K_i$ and a derivative gain $K_d$ which are previously stored in a ROM. By the way, only one kind or two kinds of gains of the above-mentioned gains may be used. In addition, a PID control system having two degrees of freedom may be configured on the basis of insertion or the like of a controller into a feedback loop of a motor current, or for a target current $I_{ref}$ of the motor current.

Next, a battery voltage $V_{batt}$ corresponding to a target voltage (motor drive command voltage) $V_{ref}$ arithmetically operated in the current feedback controller 3 is inputted to the motor driver 7. However, since the influence of a disturbance voltage $V_{dist}$ and a back electromotive voltage $V_b$ of the motor 8 are present in the signal path from the input of the target voltage $V_{ref}$ to the input of the actual input voltage $V_c$ to the motor driver 7, in actual, the value obtained by subtracting both the voltage values ($V_{dist}$ and $V_b$) from the target voltage $V_{ref}$ becomes the actual input voltage $V_c$.

The target voltage $V_{ref}$, and an actual current $I_{act}$ detected by the motor current detector 7 are both inputted to an abnormal voltage estimator 16 which estimates in turn a motor abnormality estimation voltage $V_f$ on the basis of the actual current $I_{act}$ and the target voltage $V_{ref}$. An output signal of the abnormal voltage estimator 16 is inputted to a motor abnormality judging unit 15 to thereby judge an abnormal condition of the motor.

Here, the description will be given hereinafter with respect to the details of the above-mentioned abnormal voltage estimator 16.

A disturbance estimation observer is used for the abnormal voltage estimator 16 of the present invention. The disturbance estimation observer, as shown in Expression (2) as will be described later, is adapted to form the model of the current behavior of the motor in the form of the sum of the coil impedance characteristics and the disturbance voltage.

Here, the current behavior of the motor is modeled as shown in Expression (2) on the assumption that a general disturbance estimation voltage is $V_{dist}$ and the dynamic characteristics of the disturbance voltage $V_{dist}$ is expressed in the stepped form given by the following Expression (1).

$$dV_{dist}/d_t = 0 \tag{1}$$

Consequently, the model of the current behavior of the motor for the target voltage $V_{ref}$ containing Expression (1) expressing the disturbance model and the actual current $I_{act}$ is expressed by Expression (2).

$$\frac{d}{dt}\begin{bmatrix} I_{act} \\ V_{dist} \end{bmatrix} = \begin{bmatrix} -\frac{R_m}{L_m} & -\frac{1}{L_m} \\ 0 & 0 \end{bmatrix}\begin{bmatrix} I_{act} \\ V_{dist} \end{bmatrix} + \begin{bmatrix} \frac{1}{L_m} \\ 0 \end{bmatrix}V_{ref} \tag{2}$$

$$y = [1 \ 0]\begin{bmatrix} I_{act} \\ V_{dist} \end{bmatrix}$$

where $R_m$ is a resistance value of the motor, $L_m$ is an inductance value of the motor, and y is an output value.

The disturbance voltage $V_{dist}$ as a quantity of state in Expression (2) of the current behavior model is estimated by the observer.

Next, the enlargement system of the above Expression (2) is transformed into an observable canonical system shown in the following Expression (3).

$$\frac{d}{dt}\begin{bmatrix} z_1 \\ z_2 \end{bmatrix} = \begin{bmatrix} 0 & -\alpha_1 \\ 1 & -\alpha_2 \end{bmatrix}\begin{bmatrix} z_1 \\ z_2 \end{bmatrix} + \begin{bmatrix} b'_1 \\ b'_2 \end{bmatrix}V_{ref} \tag{3}$$

$$y = [0 \ 1]\begin{bmatrix} z_1 \\ z_2 \end{bmatrix}$$

where $z_1$ and $z_2$ represent quantities of state, respectively, $\alpha_1$, $\alpha_2$, $b_1'$ and $b_2'$ represent coefficients, respectively, and $\alpha_1 = 0$, $\alpha_2 = R_m/L_m$, $b_1' = 0$ and $b_2' = 1/L_m$.

Here, the basic formulae of the observer for the above Expression (3) are expressed by the following Expressions (4) and (5).

$$\frac{d}{dt}\begin{bmatrix} \hat{z}_1 \\ \hat{z}_2 \end{bmatrix} = \begin{bmatrix} 0 & -(\alpha_1 + g_1) \\ 1 & -(\alpha_2 + g_2) \end{bmatrix}\begin{bmatrix} \hat{z}_1 \\ \hat{z}_2 \end{bmatrix} + \begin{bmatrix} g_1 \\ g_2 \end{bmatrix}I_{act} + \begin{bmatrix} b'_1 \\ b'_2 \end{bmatrix}V_{ref} \tag{4}$$

$$y = [0 \ 1]T_0\begin{bmatrix} \hat{z}_1 \\ \hat{z}_2 \end{bmatrix} \tag{5}$$

$$T_0 = \begin{bmatrix} 0 & 1 \\ -L_m & 0 \end{bmatrix}$$

In this connection, in Expression (4), $\hat{Z}_1$, $\hat{Z}_2$ represents a quantity of estimated state, and g1 and g2 represent weight coefficients and are expressed as follows, respectively.

$$g_1 = \lambda_1 \times \lambda_2$$

$$g_2 = -(R_m/L_m) - (\lambda_1 + \lambda_2)$$

where $\lambda_1$ and $\lambda_2$ represent poles of the observer, respectively.

In addition, the values of the weight coefficients $g_1$ and $g_2$ are previously determined so that the output of the disturbance voltage estimation observer becomes stable.

While the current behavior of the motor is modeled on the assumption that the above-mentioned dynamic characteristics of the disturbance voltage $V_{dist}$ are of the stepped form given by Expression (1), the disturbance voltage estimation observer may be constructed on the assumption that the above-mentioned dynamic characteristics are given in the form of a sinusoidal wave shape as a function of an angular frequency ω given by the following Expression (6).

$$\frac{d}{dt}\begin{bmatrix} V_{dist} \\ x_2 \end{bmatrix} = \begin{bmatrix} 0 & \omega \\ -\omega & 0 \end{bmatrix}\begin{bmatrix} V_{dist} \\ x_2 \end{bmatrix} \tag{6}$$

where $x_2$ represents a quantity of state.

In addition, the disturbance voltage estimation observer may be constructed on the assumption that the disturbance voltage $V_{dist}$ is expressed in the form of a polynomial (6) as a function of time t.

where $c_1$, $c_2$ and $c_3$ are constants which are determined when the waveform of the actual disturbance voltage is fixed.

$$V_{dist} = c_1 \times t^2 + c_2' \times t + c_3 \tag{7}$$

Moreover, the disturbance voltage may be estimated using the minimum-dimension observer obtained by decreasing the degree of these observers. For example, the formula of the observer when Expression (4) is made undergo the minimum dimension is expressed on the basis of the following Expressions (8) and (9).

$$dw/dt = -f_{L1}w + [f_{L1}\{(R_m/L_m) - f_{L1}\}]I_{act} - (f_{L1}/L_m)V_{ref} \tag{8}$$

$$V_{dist} = -L_m(w + f_{L1} \times I_{act}) \tag{9}$$

where w is a quantity of intermediate state, dw/dt is a time differential of the quantity of intermediate state w, and $-f_{L1}$ is a pole of the observer.

A program is expressed and arithmetically operated by a CPU so that the output signal y of the disturbance estimation observer 16 is processed through various filters 17 and the output signal of the various filters 17 is compared with a value previously recorded in a ROM of the motor abnormality judging unit 15 to thereby detect an abnormal condition of the motor. The execution and operation of this program will be described hereinafter with reference to a flow chart shown in FIG. 2.

In step S110, the motor drive command voltage value which has been obtained from the target current $I_{ref}$ and the motor actual current $I_{act}$ through the arithmetic operation in the current feedback controller 3, i.e., the target voltage $V_{ref}$ is stored in a memory. Next, in step S120, the motor actual current $I_{act}$, which has been detected by the motor current detector 9, is stored in the memory.

In step S130, both the target voltage $V_{ref}$ and the motor actual current $I_{act}$ which are stored are inputted to the disturbance voltage estimation observer. Then, in step S140, a motor abnormal voltage estimation value $V_f$ corresponding to a voltage exhibiting an abnormal condition of the motor is arithmetically operated on the basis of the operational expression of the disturbance voltage estimation observer described above in detail.

In step S141, the information of a motor rotational speed $\omega_m$ is read out. The motor rotational speed $\omega_m$ may be measured with a sensor such as an encoder or may be estimated from a back electromotive voltage. In addition, it may also be arithmetically operated from the steering speed of the steering wheel which has been measured or estimated.

In step S142, the number $N_b$ of brushes and the number $M_c$ of commutators of the motor, which are previously stored in the ROM, are read out.

In step S143, a commutation frequency $F_c$ is arithmetically operated from the rotational speed $\omega_m$ of the motor, the number $N_b$ of brushes and the number $M_c$ of commutators of the motor all of which have been read out by a commutation frequency operator 26. The commutation frequency $F_c$ is the frequency of the voltage variation due to the commutation during the rotation of the motor, and is expressed as a function of the rotational speed $\omega_m$ of the motor, the number $N_b$ of brushes and the number $M_c$ of commutators of the motor. Then, the commutation frequency operator 26 gives $F_c=f(\omega_m, N_b, M_c)$.

Figure 3:
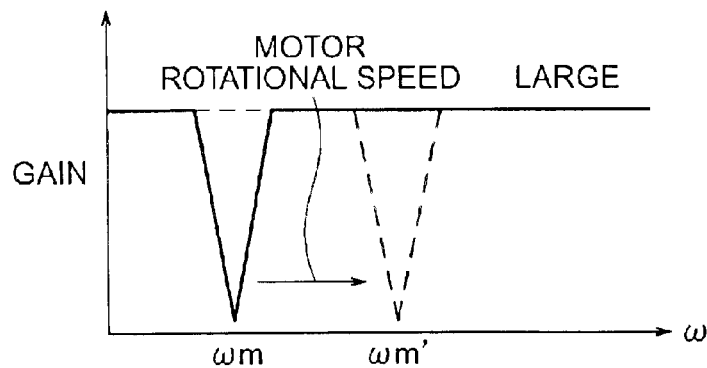
FIG. 3 is a graphical representation useful in explaining the change of a variable filter of the apparatus for detecting an abnormal condition of a motor according to the first embodiment of the present invention.

Next, FIG. 3 is a graphical representation useful in explaining the change of a variable filter in which a notch portion is changed in accordance with the rotational speed $\omega_m$ of the motor. Then, in step S144, the motor abnormality estimation voltage $V_f$ is filtered by the variable filter having the above-mentioned commutation frequency Fc as a filter frequency to obtain a motor abnormal voltage $V_{ff}$. The filter element 17 may be configured so as to subtract the abnormality estimation voltage through a band-pass filter from the motor abnormality estimation voltage $V_f$. Thus, we do not mind what configuration the filter has as long as it serves to reduce the gain of a specific frequency.

In step S150, a certain value $\epsilon_1$ which is previously stored in the ROM is compared with the absolute value of the motor abnormal voltage value $V_{ff}$. If the relationship of $|V_{ff}|\geq\epsilon_1$ is established as a result of the comparison, then it is judged in step S160 that the motor is in an abnormal condition. On the other hand, if the relationship of $|V_{ff}|<\epsilon_1$ is established, then it is judged in step S170 that the motor is in a normal condition.

Moreover, the process is returned back to the processing in step S110, and the above-mentioned steps are repeatedly executed. If it is judged in step S160 that the motor is in an abnormal condition, then the process may be ended without being returned back to step S110.

As described above, according to the apparatus for detecting an abnormal condition of a motor for use in the electric power steering apparatus according to the first embodiment, the abnormal voltage value which is generated due to the breakage, abrasion and flaws of the commutator and the brushes of the motor, the foreign object got mixed into the inside of the motor, the broken pieces of the internal components or parts of the motor, or the like is estimated, whereby it is possible to judge the abnormal condition of the inside of the motor.

In addition, the insertion of the commutation frequency operator 26 and the various filters 17 allows the abnormal condition of the motor to be judged on the basis of the abnormal voltage estimate having a certain frequency component. For example, even in the case as well where there is observed a phenomenon in which the commutation ripple or the like with which the motor is judged to be in the normal condition is generated in the form of the disturbance voltage, only the abnormal condition can be detected without making a wrong judgment.

Second Embodiment

An apparatus for detecting an abnormal condition of a motor for use in an electric power steering apparatus according to a second embodiment of the present invention will be described hereinafter in detail with reference to FIGS. 4 to 6.

Figure 4:
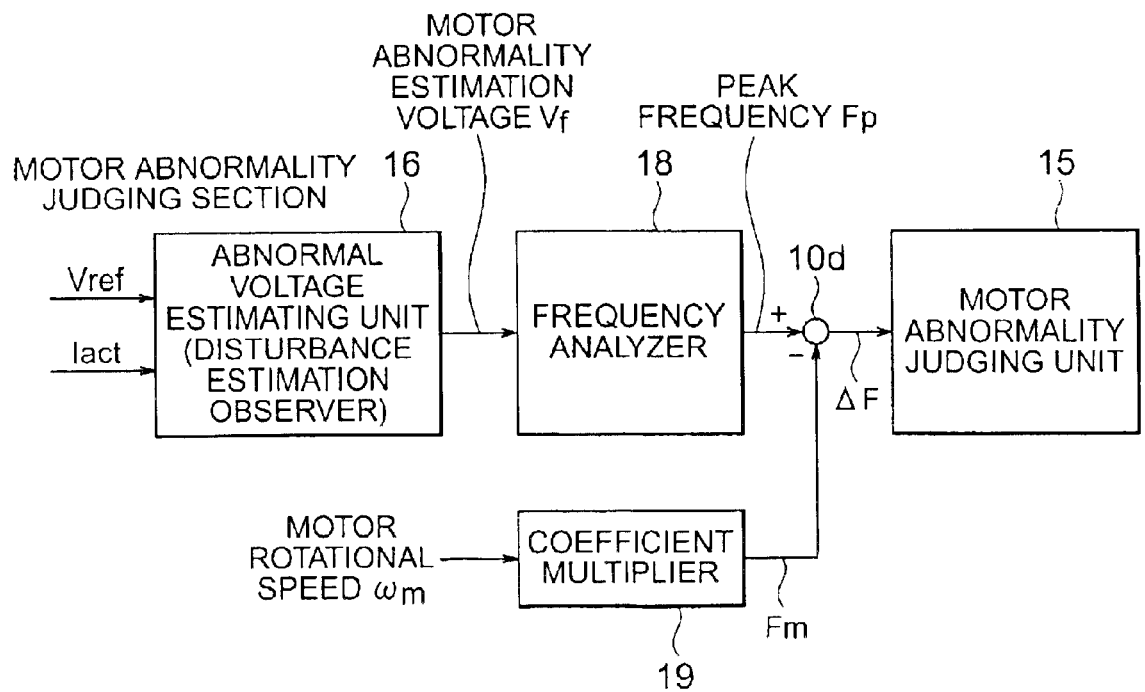
FIG. 4 is a block diagram showing a configuration of a motor abnormality judging section in an apparatus for detecting an abnormal condition of a motor according to a second embodiment of the present invention.
Figure 5:
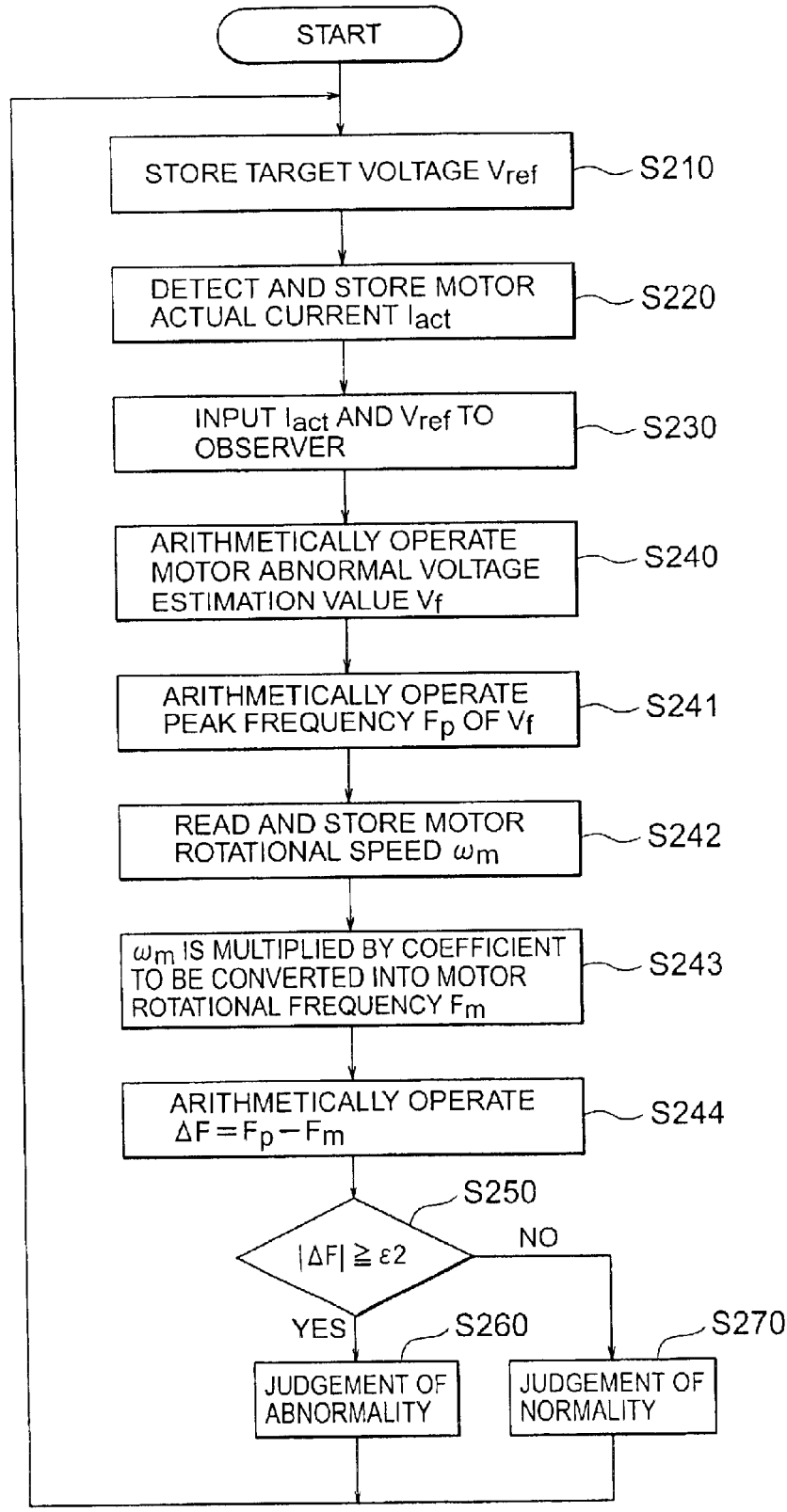
FIG. 5 is a flow chart useful in explaining the operation of the apparatus for detecting an abnormal condition of a motor according to the second embodiment of the present invention.

FIG. 4 is a block diagram showing a configuration of a portion corresponding to the section for judging an abnormal condition of a motor of the above-mentioned first embodiment, and FIG. 5 is a flow chart useful in explaining the operation of the apparatus for detecting an abnormal condition of a motor according to the second embodiment.

Figure 2:
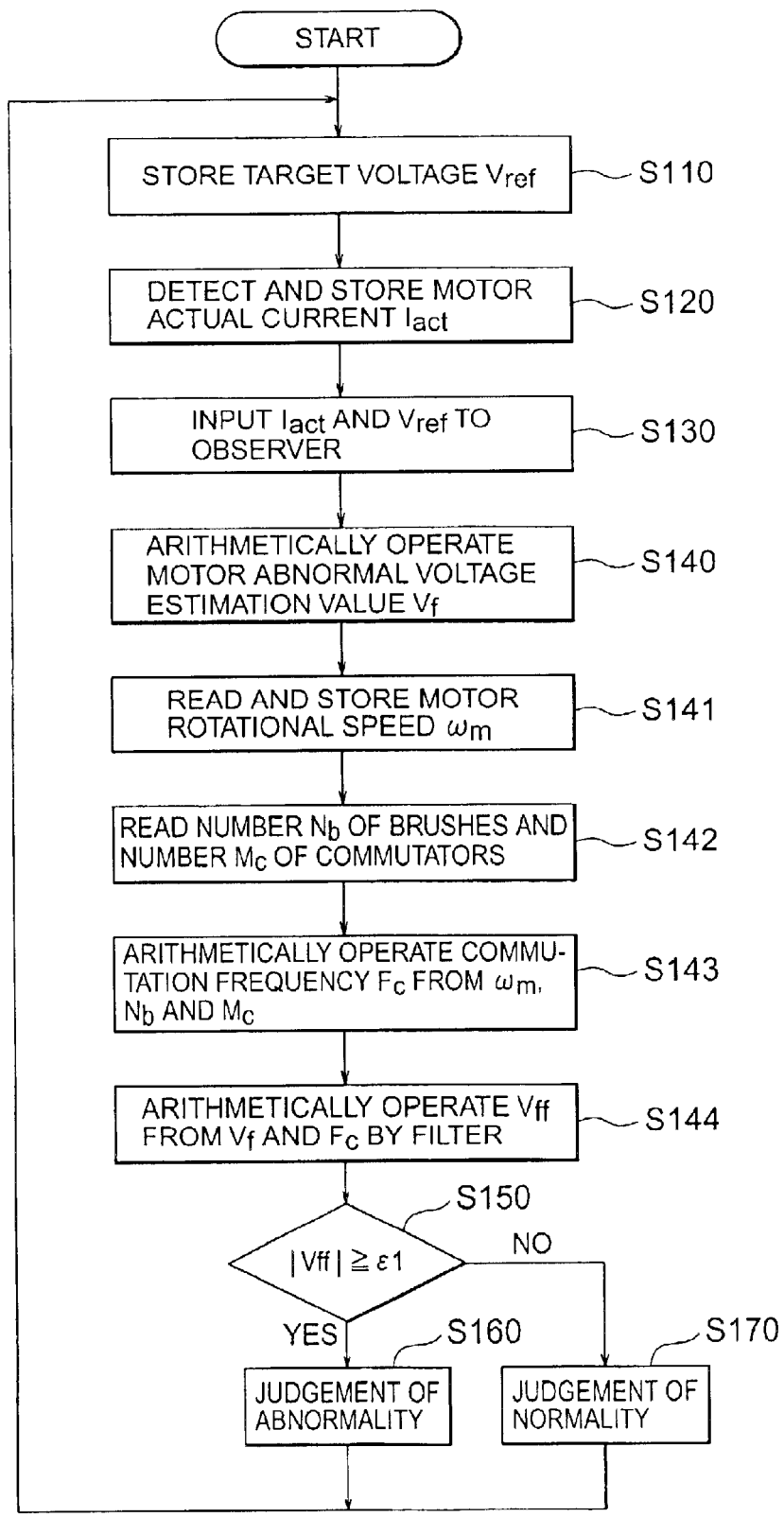
FIG. 2 is a flow chart useful in explaining the operation of the apparatus for detecting an abnormal condition of a motor according to the first embodiment of the present invention.

Since in FIG. 5, the steps from step S210 to step S240 are the same as those from step S110 to step S140 of FIG. 2, the description thereof is omitted here for the sake of simplicity.

Figure 6:
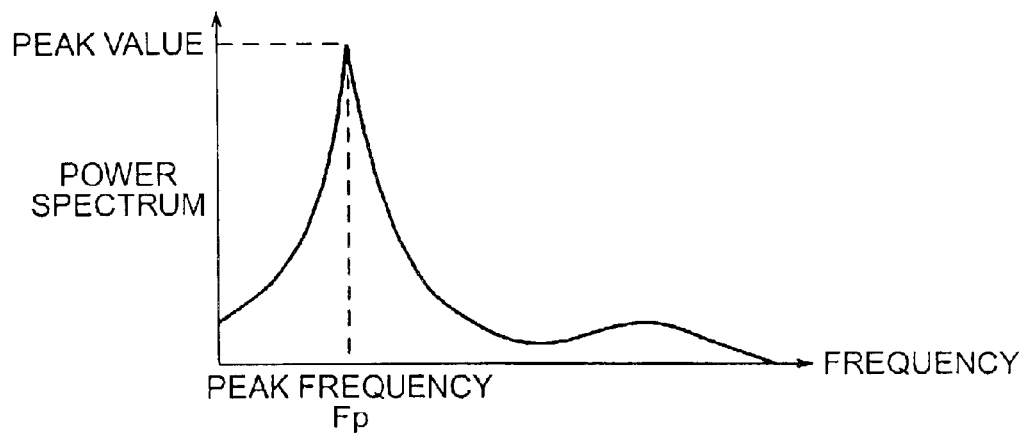
FIG. 6 is a graphical representation useful in explaining the correlation between a frequency and a power spectrum of the apparatus for detecting an abnormal condition of a motor according to the second embodiment of the present invention.

In step S241, a frequency $F_p$ exhibiting a peak value of the motor abnormality estimation voltage $V_f$ as in FIG. 6 is arithmetically operated by a frequency analyzer 18 to be outputted. As for the frequency analyzer 18, for example, the FFT (Fast Fourier Transform) may be used.

Next, in step S242, the rotational speed $\omega_m$ of the motor is read out. Then, in step S243, the rotational speed $\omega_m$ of the motor is multiplied by a coefficient by a coefficient multiplier 19 to be transformed into a frequency $F_m$ proportional to the rotational speed $\omega_m$ of the motor.

Then, in step S244, $\Delta F=F_p-F_m$ is arithmetically operated using the adder-subtractor 10*d*. Then, in step S250, a predetermined value $\epsilon_2$ which is previously stored in the ROM is compared with an absolute value of a frequency difference $\Delta F$ between the peak frequency $F_p$ of the motor abnormal voltage and the frequency $F_m$ proportional to the motor rotational speed. If the relationship of $|\Delta F|\geq\epsilon_2$ is established as a result of the comparison, then it is judged in step S260 that the motor is in an abnormal condition. On the other hand, if the relationship of $|\Delta F|<\epsilon_2$ is established as a result of the comparison, then it is judged in step S270 that the motor is in a normal condition. The subsequent steps are the same as those of the above-mentioned first embodiment.

As described above, according to the second embodiment, when the frequency $F_p$ of the motor abnormality estimation voltage is near the frequency $F_m$ proportional to the motor rotational speed, it is judged that the motor abnormal voltage is due to the commutation ripple, and thus it is possible to prevent the wrong detection of the abnormal condition. On the other hand, when a difference between the frequency $F_p$ and the frequency $F_m$ is large, since the abnormal voltage due to the factor other than the commutation ripple is generated, it is possible to judge that the motor is in an abnormal condition.

Third Embodiment

An apparatus for detecting an abnormal condition of a motor for use in an electric power steering apparatus according to a third embodiment of the present invention will be described hereinafter in detail with reference to FIGS. 7 to 9.

Figure 7:
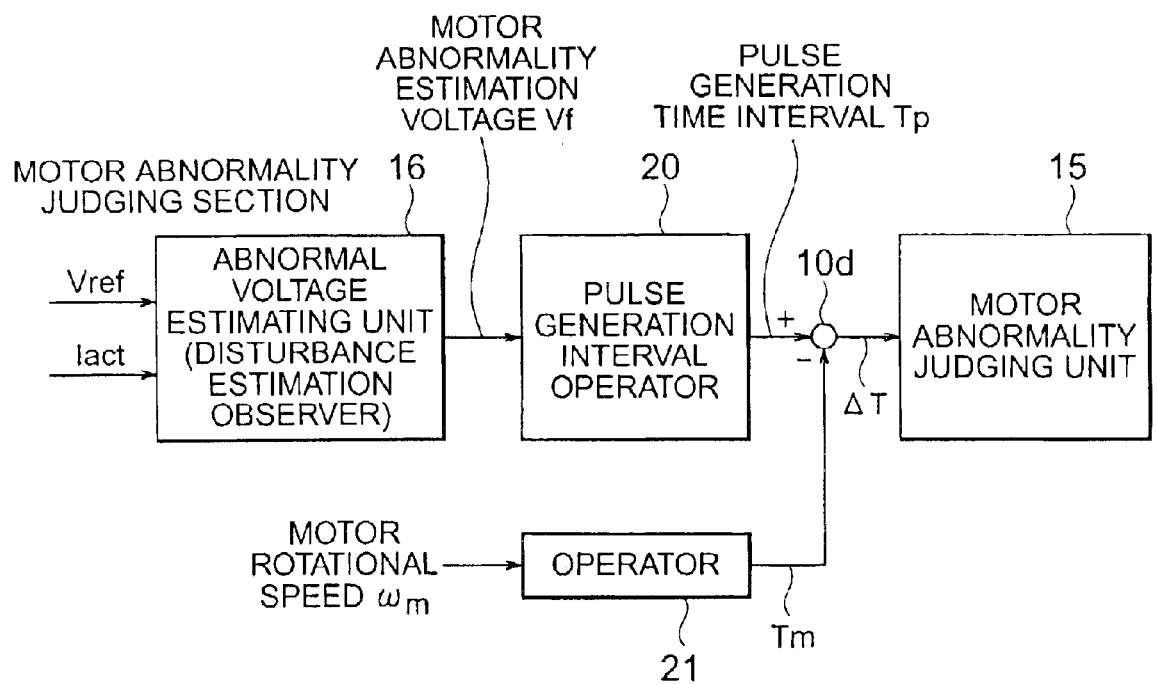
FIG. 7 is a block diagram showing a configuration of a motor abnormality judging section in an apparatus for detecting an abnormal condition of a motor according to a third embodiment of the present invention.
Figure 8:
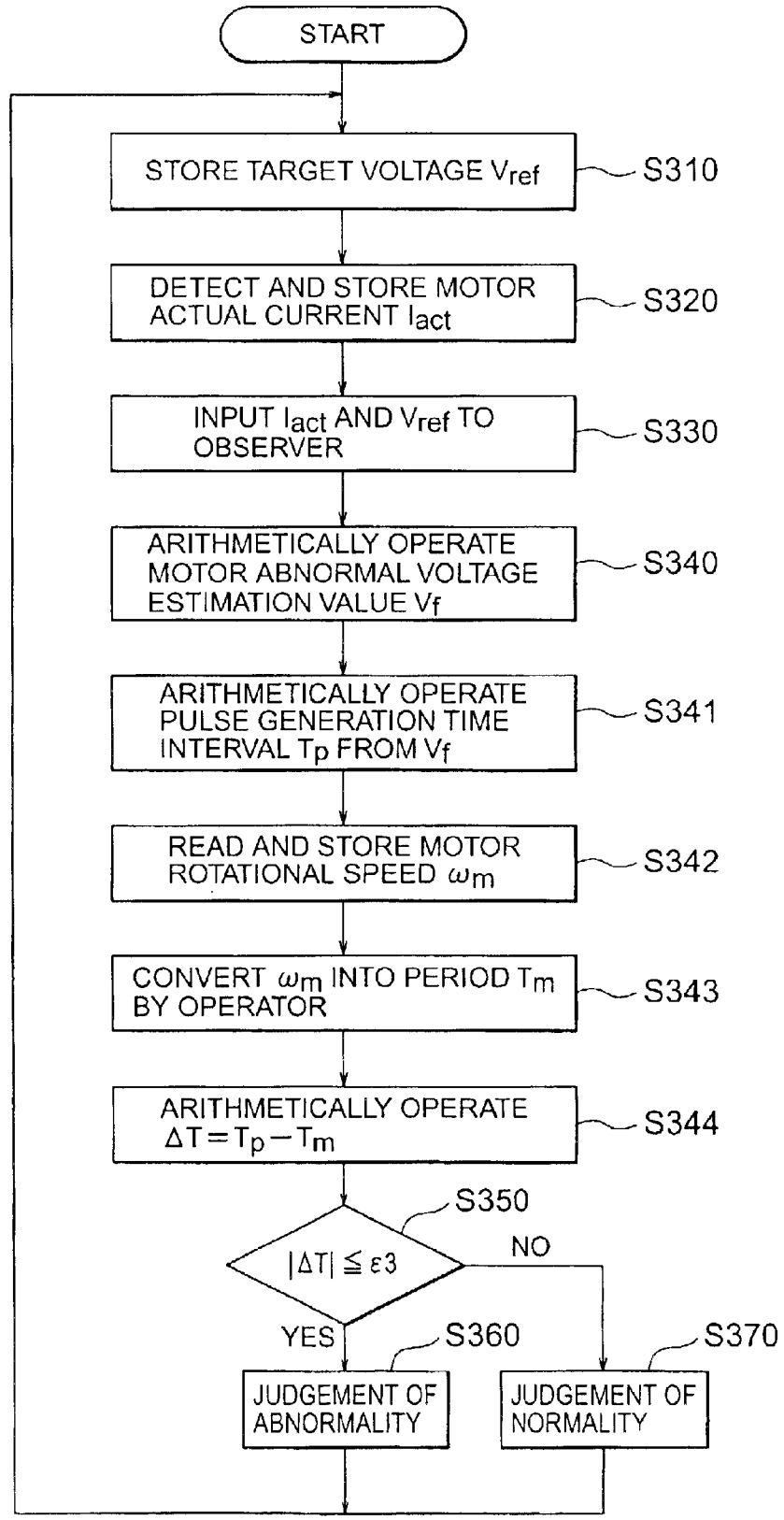
FIG. 8 is a flow chart useful in explaining the operation of the apparatus for detecting an abnormal condition of a motor according to the third embodiment of the present invention.

FIG. 7 is a block diagram showing a configuration of a portion corresponding to the section for judging an abnormal condition of a motor of the above-mentioned first embodiment, and FIG. 8 is a flow chart useful in explaining the operation of the apparatus for detecting an abnormal condition of a motor according to the third embodiment.

Since in FIG. 8, the steps from step S310 to step S340 are the same as those from step S110 to step S140 of FIG. 2, the description thereof is omitted here for the sake of simplicity.

Figure 9:
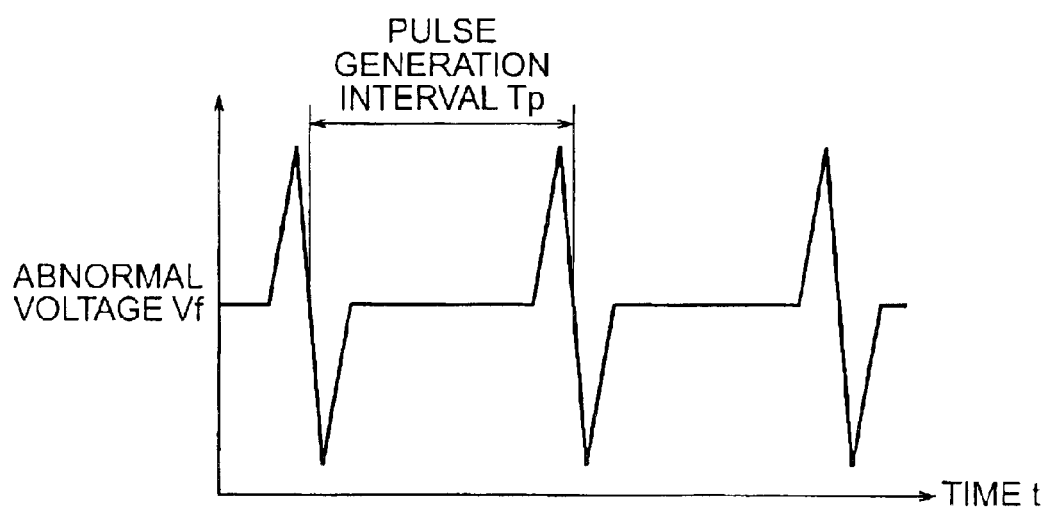
FIG. 9 is a graphical representation useful in explaining the change with time of an abnormal voltage of the apparatus for detecting an abnormal condition of a motor according to the third embodiment of the present invention.

In FIG. 8, in step S341, a time interval $T_p$ when the estimation voltage $V_f$ is generated in the form of an impulse as shown in FIG. 9 is obtained by a pulse generation interval operator 20 to be outputted. By the way, as for an example of the pulse generation interval operator 20, the wavelet transformer or the like is given.

In step S343, the rotational speed $\omega_m$ of the motor is converted into a period $T_m$ inversely proportional to the rotational speed $\omega_m$ of the motor by the operator 21. Then, in step S344, $\Delta T=T_p-T_m$ is arithmetically operated using the adder-subtractor 10*d*. Then, in step S350, a predetermined value $\epsilon_3$ which is previously stored in the ROM is compared with the absolute value of $\Delta T$.

If the relationship of $|\Delta T|\leq\epsilon_3$ is established as a result of the comparison, then it is judged in step S360 that the motor is in an abnormal condition. On the other hand, if the relationship of $|\Delta T|>\epsilon_3$ is established as a result of the comparison, then it is judged in step S370 that the motor is in the normal condition. The subsequent steps are the same as those in the above-mentioned first embodiment.

As described above, according to the third embodiment, for example, when the motor abnormal voltage is generated in the form of an impulse, and so forth, the motor abnormal voltage is substantially compared with the motor rotational speed, whereby it is possible to judge whether or not the condition concerned is the abnormal condition depending on the motor rotational speed, and also it is possible to detect the combination of the contact state between the brush and the commutator by which the abnormal condition is caused.

Fourth Embodiment

An apparatus for detecting an abnormal condition of a motor for use in an electric power steering apparatus according to a fourth embodiment of the present invention will be described hereinafter in detail with reference to FIGS. 10 and 11.

Figure 10:
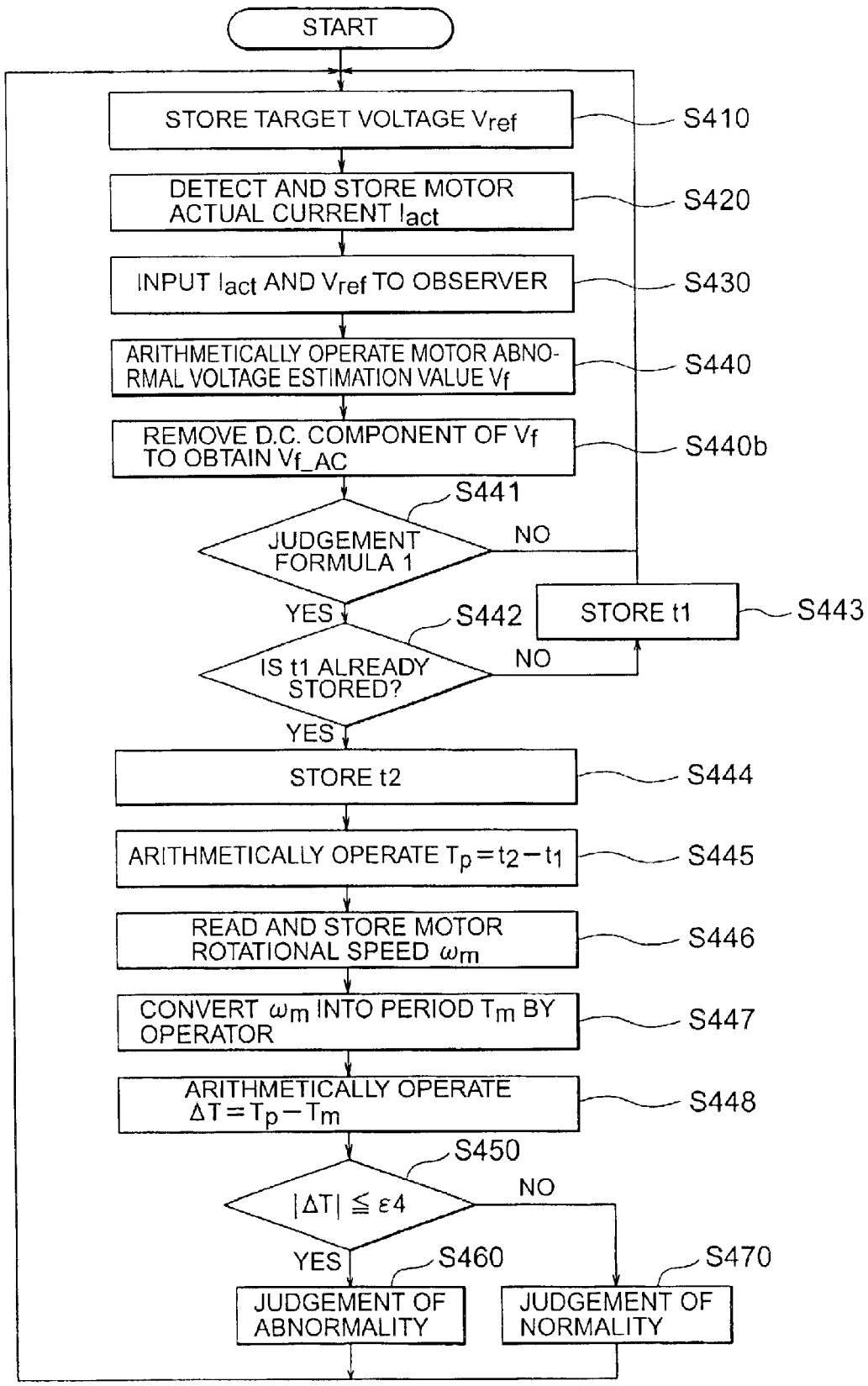
FIG. 10 is a flow chart useful in explaining the operation of an apparatus for detecting an abnormal condition of a motor according to a fourth embodiment of the present invention.
Figure 11:
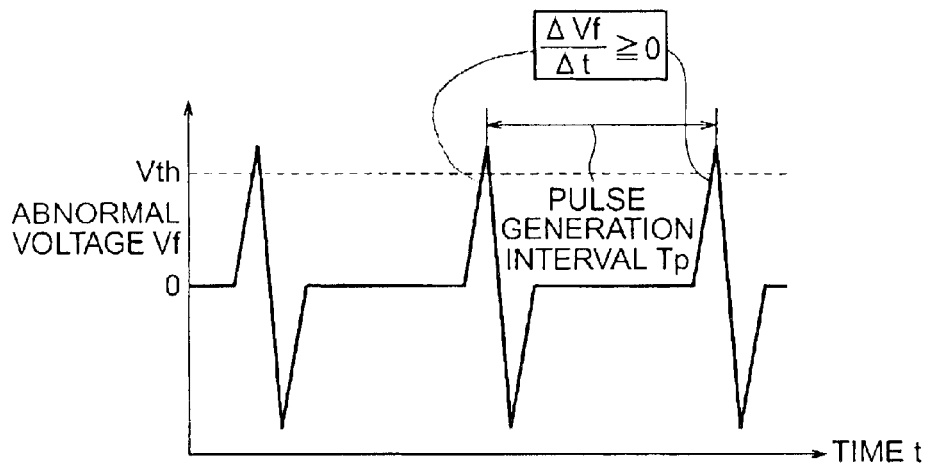
FIG. 11 is a graphical representation useful in explaining the change with time of an abnormal voltage of the apparatus for detecting an abnormal condition of a motor according to the fourth embodiment of the present invention.

FIG. 10 is a flow chart useful in explaining the operation of the apparatus for detecting an abnormal condition of a motor according to the fourth embodiment. Since in FIG. 10, the steps from step S410 to step S440 are the same as those from step S110 to step S140 of FIG. 2, the description thereof is omitted here for the sake of simplicity.

In FIG. 10, in step S440b, the D.C. component of the abnormality estimation voltage $V_f$ is removed through a high-pass filter or by arithmetically operating a mean value thereof, and the resultant voltage is assigned $V_{f\_AC}$.

The steps from step S441 to step S445 show the method of arithmetically operating the pulse generation interval $T_p$. First of all, in step S441, the judgment for the pulse generation is carried out on the basis of the following judgment formula (10).

$$|V_{f\_AC}| \geq V_{th}, \frac{\Delta V_f}{\Delta t} \geq 0 \quad (10)$$

where $V_{th}$ is a voltage value which is previously stored in the ROM, and $V_f$. t is a differential value of the abnormality estimation voltage divided by time. By the way, FIG. 11 shows the change with time of the abnormal voltage detected by the apparatus for detecting an abnormal condition of a motor.

In addition, the following Expression (11) may be used instead of Expression (10).

$$|V_{f\_AC}| \geq V_{th}, \frac{\Delta V_f}{\Delta t} \leq 0 \quad (11)$$

If the above judgment formula is met, then it is judged that the motor abnormality pulse is generated.

In step S442, if the information of initial generation time $t_1$ is not stored, then in step S443, the pulse generation time t is set in the form of T1=t and its information is stored in the ROM and then the process is returned back to step S440.

Then, in step S441, if it is judged that Expression (10) or Expression (11) is met, then the time t at that time is set in the form of T2=t this time and its information is stored in the ROM in step S444.

Next, in step S445, the pulse generation time interval Tp=T2−T1 is arithmetically operated. Since the subsequent steps are the same as those in and after step S342 shown in FIG. 8, the description thereof is omitted here for the sake of simplicity.

As described above, according to the fourth embodiment, it is possible to offer the same effects as those of the above-mentioned third embodiment.

Fifth Embodiment

An apparatus for detecting an abnormal condition of a motor for use in an electric power steering apparatus according to a fifth embodiment of the present invention will be described hereinafter in detail with reference to FIGS. 12 and 13.

Figure 12:
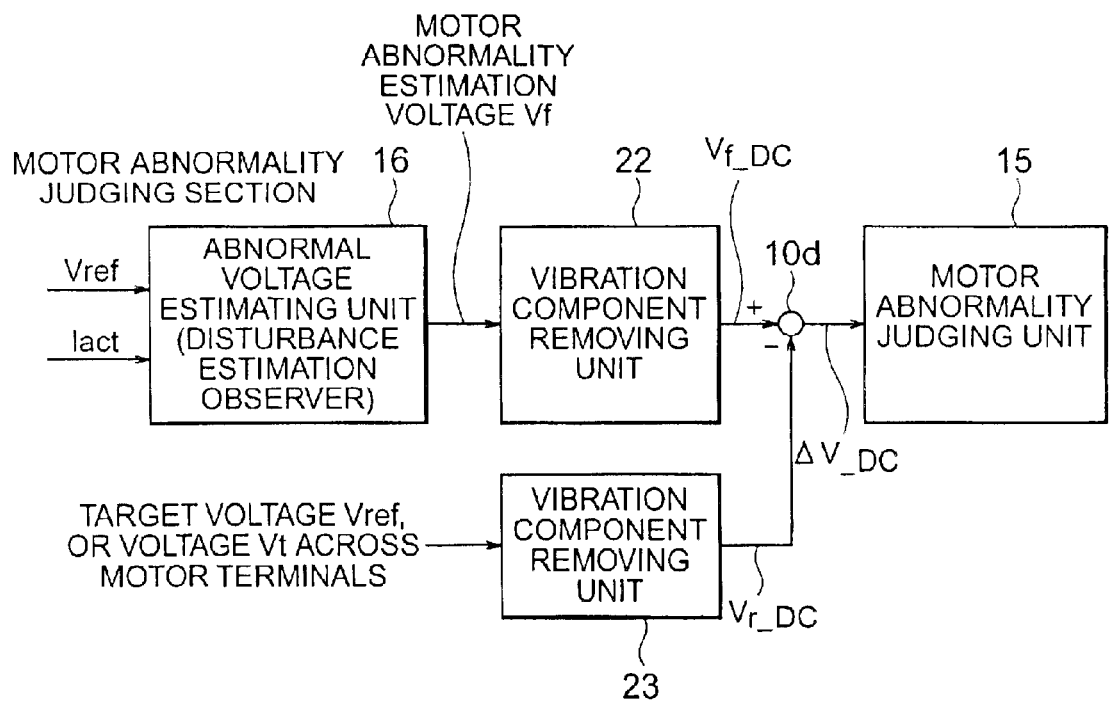
FIG. 12 is a block diagram showing a configuration of a motor abnormality judging section in an apparatus for detecting an abnormal condition of a motor according to a fifth embodiment of the present invention.
Figure 13:
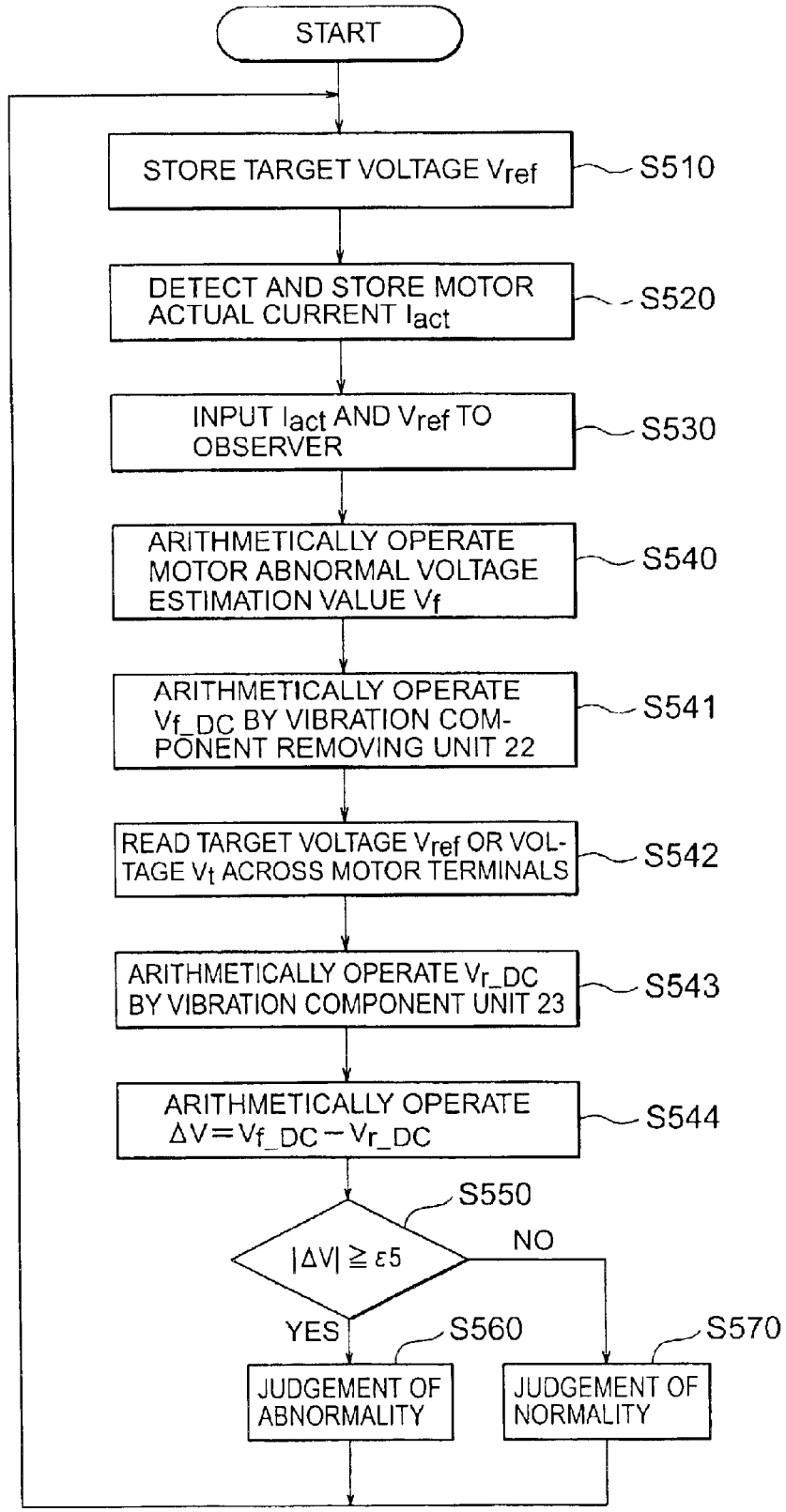
FIG. 13 is a flow chart useful in explaining the operation of the apparatus for detecting an abnormal condition of a motor according to the fifth embodiment of the present invention.

FIG. 12 is a block diagram showing a configuration of a portion corresponding to the motor abnormality judging section of the above-mentioned first embodiment, and FIG. 13 is a flow chart useful in explaining the operation of the apparatus for detecting an abnormal condition of a motor of the fifth embodiment. By the way, since in FIG. 13, the steps from step S510 to step S540 are the same as those from step S110 to step S140 shown in FIG. 2, the description thereof is omitted here for the sake of simplicity.

In FIG. 13, in step S541, a vibration component of the estimation voltage $V_f$ is removed by a vibration component removing unit 22 to leave only a D.C. component $V_{f\_DC}$. As for the vibration component removing unit 22, a low-pass filter having arbitrary degree may be used, or a method of arithmetically operating a mean value of the estimation voltage $V_f$ may be used.

Next, in step S542, the target voltage $V_{ref}$, or the voltage $V_t$ developed across the motor terminals is read out. Then, in step S543, the voltage value read out in step S542 is filtered by a vibration component removing unit 23 to leave only a D.C. component $V_{r\_DC}$.

Then, in step S544, $\Delta V = T_{f\_DC} - V_{r\_DC}$ is arithmetically operated using the adder-subtractor 10d. Then, in step S550, a predetermined value $\epsilon_5$, which is previously stored in the ROM, is compared with the absolute value of $\Delta T$.

If the relationship of $|\Delta V| \geq \epsilon_5$ is established as a result of the comparison, then it is judged in step S560 that the motor is in an abnormal condition. On the other hand, if the relationship of $|\Delta V| < \epsilon_5$ is established as a result of the comparison, then it is judged in step S570 that the motor is in the normal condition. The subsequent steps are the same as those in the above-mentioned first embodiment.

As described above, according to the fifth embodiment, it is possible to detect the contact state between the brush and the commutator, and the state in which the brush drop voltage is increased due to the abrasion of the brush or the like.

Sixth Embodiment

An apparatus for detecting an abnormal condition of a motor for use in an electric power steering apparatus according to a sixth embodiment of the present invention will be described hereinafter in detail with reference to FIGS. 14 and 15.

Figure 14:
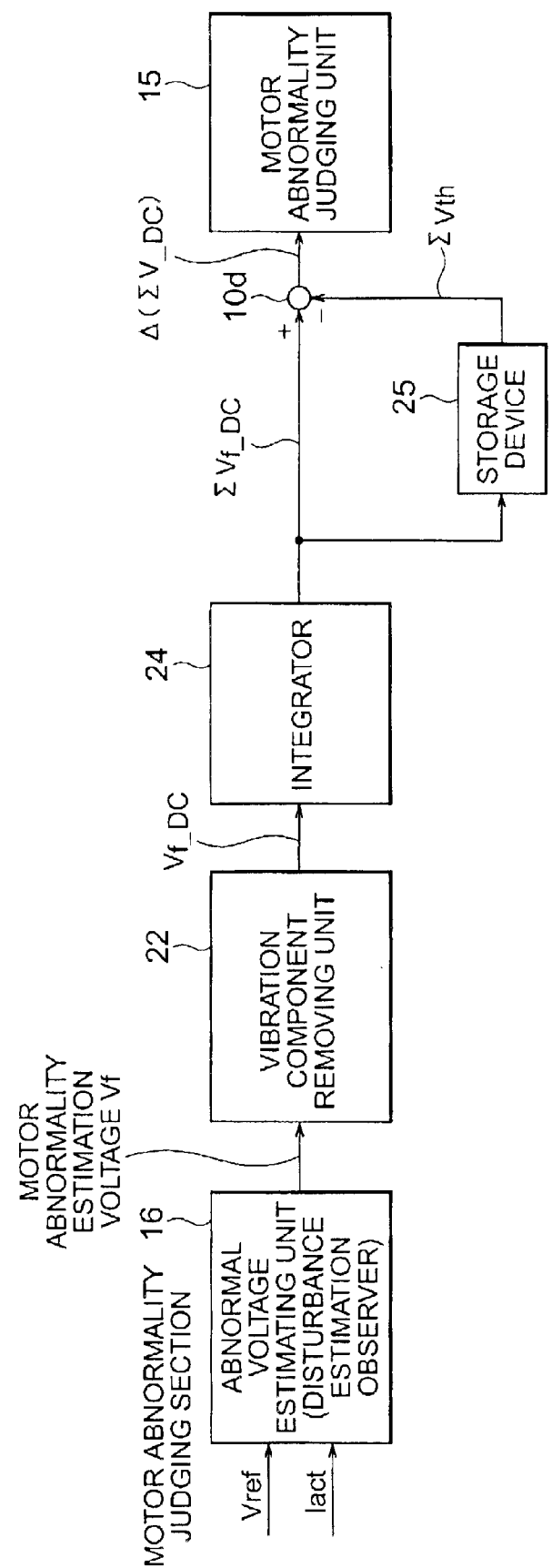
FIG. 14 is a block diagram showing a configuration of a motor abnormality judging section in an apparatus for detecting an abnormal condition of a motor according to a sixth embodiment of the present invention.
Figure 15:
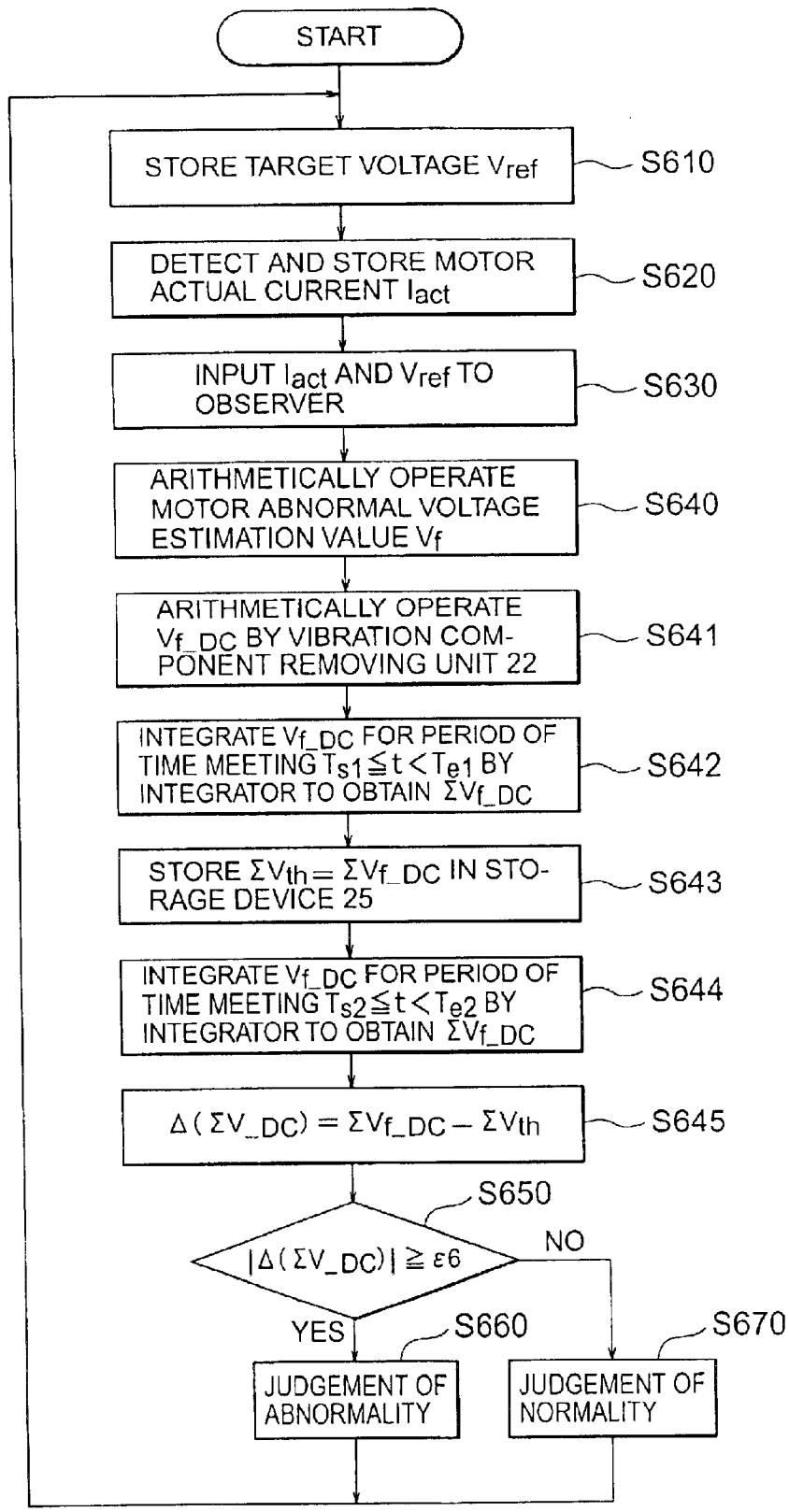
FIG. 15 is a flow chart useful in explaining the operation of the apparatus for detecting an abnormal condition of a motor according to the sixth embodiment of the present invention.

FIG. 14 is a block diagram showing a configuration of a portion corresponding to the motor abnormality judging section of the above-mentioned first embodiment, and FIG. 15 is a flow chart useful in explaining the operation of the apparatus for detecting an abnormal condition of a motor of the sixth embodiment. By the way, since in FIG. 15, the steps from step S610 to step S640 are the same as those from step S110 to step S140 shown in FIG. 2, the description thereof is omitted here for the sake of simplicity.

In FIG. 15, in step S641, a D.C. component $V_{f\_DC}$ of the motor abnormality estimation voltage $V_f$ is arithmetically operated by a vibration component removing unit 22. In step S642, the D.C. component $V_{f\_DC}$ is integrated for a predetermined time interval from $T_{s1}$ to $T_{e1}$ by an integrator 24.

In addition, in step S643, the value obtained by integrating the D.C. component $V_{f\_hd\ DC}$, i.e., $\Sigma V_{f\_DC}$ is stored in a storage device 25 to be made a threshold voltage $\Sigma V_{th}$ used in the judgment of the motor abnormality.

Next, in step S644, the D.C. component $V_{f\_DC}$ is integrated for a period of time from $T_{s2}$ to $T_{e2}$ for which the relationships of $T_{e1} \leq T_{s2} \leq T_{e2}$ and $T_{e1}-T_{s1}=T_{e2}-T_{s2}$ are established by the integrator 24 to obtain $\Sigma V_{f\_DC}$.

Then, in step S645, $\Delta(\Sigma V_{f\_DC})=\Sigma V_{f\_DC}-\Sigma V_{th}$ is arithmetically operated. Then, in step S650, a predetermined value $\epsilon_6$, which is previously stored in the ROM, is compared with the absolute value of $\Delta(\Sigma V_{f\_DC})$.

If the relationship of $|\Delta(\Sigma V_{f\_DC})| \geq \epsilon_6$ is established as a result of the comparison, then it is judged in step S660 that the motor is in an abnormal condition. On the other hand, if the relationship of $|\Delta V| < \epsilon_6$ is established as a result of the comparison, then it is judged in step S670 that the motor is in the normal condition. The subsequent steps are the same as those in the above-mentioned first embodiment.

As described above, according to the sixth embodiment, since the state of the past estimation voltage can be stored to be compared with the current estimation voltage, it is possible to detect the change in brush drop voltage due to the long term change of the abrasion of the brush or the like.

By the way, while in each of the above-mentioned first to sixth embodiments, the apparatus for detecting an abnormal condition of a motor for use in the electric power steering apparatus has been described, the present invention is not intended to be limited thereto. That is to say, the apparatus can similarly judge an abnormal condition in the inside of the motor as long as it uses an electric motor.

The apparatus for detecting an abnormal condition of an electric motor according to the present invention includes: motor current detecting means for detecting an actual current caused to flow through the motor; feedback controlling means for feedback-controlling a target voltage value that gives the motor a driving command in accordance with the deviation of the actual current from an inputted target current; abnormal voltage estimating means for on the basis of the target voltage and the actual current, estimating an abnormal voltage estimation value corresponding to a voltage exhibiting an abnormal condition caused in the motor; commutation frequency arithmetically operating means for arithmetically operating a commutation frequency on the basis of a rotational speed of the motor, and the number of commutators and the number of brushes of the motor; a filter device for changing a filter frequency in accordance with the commutation frequency to filter the abnormal voltage estimation value estimated by the abnormal voltage estimating means; and motor abnormality judging means for judging an abnormal condition of the motor on the basis of the comparison of the abnormal voltage estimation value filtered by the filter device with a predetermined abnormal voltage value previously stored. Consequently, it is possible to estimate the abnormal voltage value caused by the influence of the disturbance voltage due to, for example, breakage, abrasion and flaws of a commutator and brushes of the motor, or a foreign object got mixed into the inside of the motor, broken pieces of internal components or parts of the motor, or the like, whereby the abnormal condition of the motor due to the influence of the disturbance voltage can be judged.

Furthermore, the apparatus for detecting an abnormal condition of a motor includes a filter device for changing a filter frequency in accordance with the commutation frequency to filter an abnormal voltage estimation value estimated by the abnormal voltage estimating unit, and the motor abnormality judging unit judges an abnormal condition of the motor on the basis of the comparison of the abnormal voltage estimation value filtered by the filter device with a predetermined abnormal voltage value previously stored, whereby since even if a commutation ripple unrelated to an abnormal condition of the motor is generated depending on the rotational speed of the motor, the abnormal condition can be judged after removing this component by the filter device, the voltage variation due to a commutation ripple can be prevented from being wrongly judged as the abnormal condition.

Further, the apparatus for detecting an abnormal condition of an electric motor according to the present invention includes: motor current detecting means for detecting an actual current caused to flow through the motor; feedback controlling means for feedback-controlling a target voltage value that gives the motor a driving command in accordance with the deviation of the actual current from an inputted target current; abnormal voltage estimating means for on the basis of the target voltage and the actual current, estimating an abnormal voltage estimation value corresponding to a voltage exhibiting an abnormal condition caused in the motor; frequency analyzing means for carrying out frequency analysis with respect to the abnormal voltage estimation value to output information of a peak frequency on the basis of the result of the frequency analysis; and motor abnormality judging means for judging an abnormal condition of the motor on the basis of the deviation of the peak frequency from a rotational frequency of the motor corresponding to a rotational speed of the motor. Consequently, if a commutation ripple independent of the abnormal condition of the motor occurs in accordance with the rotational speed of the motor, this component is removed by the filter device to judge the abnormal condition, whereby the voltage variation due to the commutation ripple can be prevented from incorrectly being judged as the abnormal voltage.

Further, the apparatus for detecting an abnormal condition of an electric motor according to the present invention includes: motor current detecting means for detecting an actual current caused to flow through the motor; feedback controlling means for feedback-controlling a target voltage value that gives the motor a driving command in accordance with the deviation of the actual current from an inputted target current; abnormal voltage estimating means for on the basis of the target voltage and the actual current, estimating an abnormal voltage estimation value corresponding to a voltage exhibiting an abnormal condition caused in the motor; time interval arithmetically operating means for arithmetically operating time intervals of generation of the abnormal voltages on the basis of the abnormal voltage estimation value; and motor abnormality judging means for judging an abnormal condition of the motor on the basis of the time intervals of generation of the abnormal voltages arithmetically operated by the time interval arithmetically operating means, and the rotational frequency of the motor corresponding to the rotational speed of the motor. Consequently, for example, an interval of generation is found with respect to the impulse shape abnormal voltage estimation value periodically generated, and this is compared with the rotational speed of the motor, whereby it is possible to judge as the abnormal condition the case where the voltage estimation value is generated with a period in proportion to the rotational speed of the motor.

Further, according to the apparatus for detecting an abnormal condition of an electric motor of the present invention, the time interval arithmetically operating means includes: D.C. component removing means for removing a D.C. component of the abnormal voltage estimation value estimated by the abnormal voltage estimating means; abnormal voltage generation judging means for judging generation of the abnormal voltage on the basis of the abnormal voltage estimation value from which the D.C. component is removed by the D.C. component removing means, and a predetermined abnormal voltage value previously stored; and storage means for storing therein information of time intervals of generation of the abnormal voltage judged by the abnormal voltage generation judging means, and the motor abnormality judging means judges an abnormal condition of the motor on the basis of the time intervals of generation of the abnormal voltages the information of which is stored in the storage means, and the rotational frequency of the motor corresponding to the rotational speed of the motor. Consequently, for example, an interval of generation is found with respect to the impulse shape abnormal voltage estimation value periodically generated, and this is compared with the rotational speed of the motor, whereby it is possible to judge as the abnormal condition the case where the voltage estimation value is generated with a period in proportion to the rotational speed of the motor.

Further, the apparatus for detecting an abnormal condition of an electric motor according to the present invention includes: motor current detecting means for detecting an actual current caused to flow through the motor; feedback controlling means for feedback-controlling a target voltage value that gives the motor a driving command in accordance with the deviation of the actual current from an inputted target current; abnormal voltage estimating means for on the basis of the target voltage and the actual current, estimating an abnormal voltage estimation value corresponding to a voltage exhibiting an abnormal condition caused in the motor; first vibration component removing means for removing a vibration component of the abnormal voltage estimation value estimated by the abnormal voltage estimating means; second vibration component removing means for removing a vibration component of the target voltage or a surveyed motor voltage; and motor abnormality judging means for judging an abnormal condition of the motor on the basis of the abnormal voltage estimation value from which the vibration component is removed by the first vibration component removing means, and the target voltage or the surveyed motor voltage from which the vibration component is removed by the second vibration component removing means. Consequently, the vibration components are removed, and comparison is made between the abnormal voltage estimation value and the target voltage or actual motor voltage value with respect to the D.C. component, whereby it is possible to detect a condition, in which brush drop is increased, and the like due to, for example, a change of the motor with time.

Further, according to the apparatus for detecting an abnormal condition of an electric motor of the present invention, the motor abnormality judging means judges an abnormal condition of the motor on the basis of a preset voltage value instead of the target voltage or the surveyed motor voltage from which the vibration component is removed by the second vibration component removing means. Consequently, comparison is made between the abnormal voltage estimation value and the target voltage or actual motor voltage value with respect to the D.C. component, whereby it is possible to detect a condition, in which brush drop is increased, and the like due to, for example, a change of the motor with time.

Further, the apparatus for detecting an abnormal condition of an electric motor of the present invention further includes: arithmetically operating means for arithmetically operating the deviation of the target voltage or the surveyed motor voltage from which the vibration component is removed from the abnormal voltage estimation value from which the vibration component is removed; cumulative arithmetically operating means for arithmetically operating the cumulative deviation obtained by accumulating the deviation arithmetically operated by the arithmetically operating means at predetermined time intervals; and storage means for storing therein the past cumulative deviation obtained by the cumulative arithmetically operating means, and the motor abnormality judging means judges an abnormal condition of the motor on the basis of the deviation of the current cumulative deviation obtained by the cumulative arithmetically operating means from the past cumulative deviation stored in the storage means. Consequently, the cumulative value at a certain time in the past is stored, and this is compared with the current cumulative value, whereby it is possible to detect the abnormal condition due to, for example, a change of the motor with time.

While the present invention has been particularly shown and described with reference to the preferred embodiments and the specified modifications thereof, it will be understood that the various changes and other modifications will occur to those skilled in the art without departing from the scope and true spirit of the invention. The scope of the invention is, therefore, to be determined solely by the appended claims.

What is claimed is:

1. An apparatus for detecting an abnormal condition of an electric motor comprising:
   motor current detecting means for detecting an actual current flowing through a motor;
   feedback controlling means for feedback-controlling a target voltage that gives the motor a driving command in accordance with deviation of the actual current from a target current;
   abnormal voltage estimating means for, based on the target voltage and the actual current, estimating an abnormal voltage estimation value corresponding to a voltage exhibiting an abnormal condition in the motor;
   commutation frequency arithmetically determining means for arithmetically determining a commutation frequency based on rotational speed of the motor, and number of commutators and number of brushes of the motor;
   a filter device for changing a filter frequency in accordance with the commutation frequency to filter the abnormal voltage estimation value estimated by the abnormal voltage estimating means; and
   motor abnormality judging means for determining an abnormal condition of the motor based on comparison of the abnormal voltage estimation value filtered by the filter device with an abnormal voltage value previously stored.

2. An apparatus for detecting an abnormal condition of an electric motor, comprising:
   motor current detecting means for detecting an actual current flowing through a motor;
   feedback controlling means for feedback-controlling a target voltage that gives the motor a driving command in accordance with deviation of the actual current from a target current;
   abnormal voltage estimating means for, based on the target voltage and the actual current, estimating an abnormal voltage estimation value corresponding to a voltage exhibiting an abnormal condition in the motor;
   judgment value calculating means for calculating a judgment value used to determine an abnormal condition of the motor based on the abnormal voltage estimation value; and motor abnormality judging means for determining an abnormal condition of the motor based on rotational frequency of the motor corresponding to rotational speed of the motor, and the judgment value.

3. The apparatus for detecting an abnormal condition of an electric motor according to claim 2, wherein:

the judgment value calculating means includes frequency analyzing means for carrying out a frequency analysis with respect to the abnormal voltage estimation value to output information of a peak frequency, based on the frequency analysis, and the motor abnormality judging means determines an abnormal condition of the motor based on deviation of the peak frequency from the rotational frequency of the motor corresponding to the rotational speed of the motor.

4. The apparatus for detecting an abnormal condition of an electric motor according to claim 2, wherein:

the judgment value calculating means includes time interval arithmetically determining means for arithmetically determining time intervals of generation of the abnormal voltages based on the abnormal voltage estimation value; and the motor abnormality judging means determines an abnormal condition of the motor based on the time intervals of generation of the abnormal voltages arithmetically determined by the time interval arithmetically operating means, and the rotational frequency of the motor corresponding to the rotational speed of the motor.

5. The apparatus for detecting an abnormal condition of an electric motor according to claim 4, wherein the time interval arithmetically determining means comprises:

D.C. component removing means for removing a D.C. component of the abnormal voltage estimation value estimated by the abnormal voltage estimating means;

abnormal voltage generation judging means for determining generation of the abnormal voltage based on the abnormal voltage estimation value from which the D.C. component is removed by the D.C. component removing means, and an abnormal voltage value previously stored; and storage means for storing information of time intervals of generation of the abnormal voltage judged by the abnormal voltage generation determining means, wherein the motor abnormality judging means determines an abnormal condition of the motor based on the time intervals of generation of the abnormal voltages, the information of which is stored in the storage means, and the rotational frequency of the motor corresponding to the rotational speed of the motor.

6. An apparatus for detecting an abnormal condition of an electric motor comprising:

motor current detecting means for detecting an actual current flowing through a motor;

feedback controlling means for feedback-controlling a target voltage that gives the motor a driving command in accordance with deviation of the actual current from a target current;

abnormal voltage estimating means for, based on the target voltage and the actual current, estimating an abnormal voltage estimation value corresponding to a voltage exhibiting an abnormal condition in the motor;

first vibration component removing means for removing a vibration component of the abnormal voltage estimation value estimated by the abnormal voltage estimating means;

second vibration component removing means for removing a vibration component of the target voltage or a surveyed motor voltage; and motor abnormality judging means for determining an abnormal condition of the motor based on the abnormal voltage estimation value from which the vibration component is removed by the first vibration component removing means, and the target voltage or the surveyed motor voltage from which the vibration component is removed by the second vibration component removing means.

7. The apparatus for detecting an abnormal condition of an electric motor according to claim 6, wherein the motor abnormality judging means determines an abnormal condition of the motor based on a preset voltage value, instead of the target voltage or the surveyed motor voltage from which the vibration component is removed by the second vibration component removing means.

8. The apparatus for detecting an abnormal condition of an electric motor according to claim 6, further comprising:

arithmetically operating means for arithmetically determining the deviation of (i) the target voltage or the surveyed motor voltage from which the vibration component is removed, from (ii) the abnormal voltage estimation value from which the vibration component is removed;

cumulative arithmetically operating means for arithmetically determining the cumulative deviation obtained by accumulating the deviation arithmetically determined by the arithmetically operating means at predetermined time intervals; and storage means for storing past cumulative deviation obtained by the cumulative arithmetically operating means, wherein the motor abnormality judging means determines an abnormal condition of the motor based on the deviation of the current cumulative deviation obtained by the cumulative arithmetically operating means from the past cumulative deviation stored in the storage means.

* * * * *